United States Patent [19]
Hymes et al.

[11] Patent Number: 5,868,863
[45] Date of Patent: *Feb. 9, 1999

[54] METHOD AND APPARATUS FOR CLEANING OF SEMICONDUCTOR SUBSTRATES USING HYDROFLUORIC ACID (HF)

[75] Inventors: Diane J. Hymes, San Jose; Michael Ravkin, Sunnyvale; Xiuhua Zhang, San Jose; Wilbur C. Krusell, Palo Alto, all of Calif.

[73] Assignee: OnTrak Systems, Inc., Milpitas, Calif.

[ * ] Notice: The term of this patent shall not extend beyond the expiration date of Pat. No. 5,858,109.

[21] Appl. No.: 791,688

[22] Filed: Jan. 30, 1997

Related U.S. Application Data

[63] Continuation-in-part of Ser. No. 542,531, Oct. 13, 1995.
[51] Int. Cl.$^6$ ...................................................... B08B 3/00
[52] U.S. Cl. ............................. 134/28; 134/2; 134/6; 134/26
[58] Field of Search ................................ 134/1, 1.3, 2, 3, 134/26, 28, 6

[56] References Cited

U.S. PATENT DOCUMENTS

| | | | |
|---|---|---|---|
| 4,569,695 | 2/1986 | Yamashita et al. | 134/1 |
| 4,917,123 | 4/1990 | McConnell et al. | 134/95 |
| 5,294,570 | 3/1994 | Fleming, Jr. et al. | 134/3 X |
| 5,518,552 | 5/1996 | Tanoue et al. | 134/1 |
| 5,543,030 | 8/1996 | Shiramizu et al. | 205/464 |
| 5,639,311 | 6/1997 | Holley et al. | 134/6 |
| 5,662,769 | 9/1997 | Schonauer et al. | 134/2 X |

OTHER PUBLICATIONS

Eitoku, Post–CMP Cleaning Technology, Simicon Korea 95, pp. 29–36, Jan. 1995.
CA vol. 127, No. 102571v: Cristenson, Particle Removal in Solutions of Dilute HF, Semiconductor Pure Water Chemical Conference, 1996, 15th, pp. 289–300, 1997.

*Primary Examiner*—Jill Warden
*Assistant Examiner*—Alexander Markoff
*Attorney, Agent, or Firm*—Blakely, Sokoloff, Taylor & Zafman LLP

[57] ABSTRACT

A cleaning method and apparatus using very dilute hydrofluoric acid (HF) for cleaning silicon wafers and semiconductor substrates. The HF is delivered to the core of a brush where the solution is absorbed by the brush and then applied by the brush onto the substrate. This delivery system applies the chemical solutions uniformly to the semiconductor substrate and reduces the volumes of chemical solutions used in a scrubbing process. The process of the present invention uses very dilute HF and allows a thin oxide to be etched but not completely removed so as to maintain a hydrophilic surface state. Thus, this invention presents a chemical mechanical cleaning process with in-situ etching with the use of PVA brushes on a brush scrubber. Very accurate control of etch rate is obtained and, therefore, makes this process suitable to multiple cleaning applications of silicon wafers and semiconductor substrates.

13 Claims, 3 Drawing Sheets

METHOD AND APPARATUS FOR CLEANING OF SEMICONDUCTOR SUBSTRATES USING HYDROFLUORIC ACID (HF)

This is a continuation-in-part of U.S. patent application Ser. No. 08/542,531, entitled "Method and Apparatus for Chemical Delivery Through the Brush", filed Oct. 13, 1995, and assigned to the corporate assignee of the present invention.

BACKGROUND OF THE INVENTION

1. Field of the Invention

This invention relates to methods of processing a substrate, and more specifically, to a chemical mechanical scrubbing process using very dilute hydrofluoric acid (HF) for cleaning, for example, semiconductor wafers, including bare silicon wafers where the semiconductor wafers have chemically or thermally grown or deposited oxide layers in which the oxide layers may or may not have been polished by CMP.

2. Background Information

In the manufacture of semiconductor devices, the surface of semiconductor wafers must be cleaned of wafer contaminants. If not removed, wafer contaminants may affect device performance characteristics and may cause device failure to occur at faster rates than usual.

One problem associated with cleaning silicon wafers whose surface contains a very thin oxide, such as a native (passivation) oxide or a chemically grown oxide from a previous cleaning process, is that the surface metals (e.g., contaminants) to be removed may be on top of the oxide, in the oxide or at the oxide/silicon interface. This native oxide is typically less than 20 Å in thickness. Therefore, in order to remove a certain, predetermined thickness of the thin oxide, a very controlled thin oxide etch must be employed. If the oxide is entirely removed, the surface becomes hydrophobic and may present an adverse surface condition to minimizing surface particulate. Therefore, the goal of the process is to etch as much oxide as possible, removing contamination on the surface of the oxide and incorporated within the native oxide, without removing all of the oxide, thereby maintaining a uniformly hydrophilic surface.

A scrubber that scrubs a wafer on either one or both sides may be used to remove wafer contaminants. The type of cleaning solution (solution) used in the scrubber may depend upon the type of contaminants to be removed, the particular type of wafer to be scrubbed, and/or the particular manufacturer's preferred method for cleaning. For example, some manufacturers require a low level of contamination and may use a chemical solution for scrubbing, while other manufacturers have a higher contamination tolerance (i.e. less contamination need be removed) and may use water for scrubbing.

Double sided scrubbers that use soft sponge like (e.g., PVA) brushes to simultaneously clean both sides of the wafer are widely used for cleaning of silicon wafers, post CMP (chemical mechanical planarization) cleaning and general fab cleaning. The effectiveness of scrubbing wafers with soft brushes to remove surface defects has been demonstrated in both research and production. Ammonium hydroxide solution added to DI Water (DIW) during scrubbing cycle enhances the cleaning performance in many cleaning applications, especially for CMP cleaning. In the case of CMP cleaning, the use of ammonium hydroxide solution helps to remove slurry particles from the wafer surface and prevent brush loading by inducing a negative zeta potential on the particle, PVA brush and the wafer surface, regardless of their zeta potential in DIW. Therefore, the use of dilute ammonium hydroxide solution helps to remove slurry particles, and the metallic contamination associated with them, from the wafer surface. Metallic contamination not associated with slurry particles is present in the liquid part of the polishing slurry or may come from polishing equipment, used polishing pads and pad conditioning tools.

The ammonium hydroxide solution is effective for the removal of surface contamination. However, if contamination resides under the surface, within the oxide bulk, an etching chemistry may be desirable. The etching chemistry would permit removal of a thin oxide layer from the surface and the contaminants incorporated within. This removal of metallic contamination is required for more CMP applications which occur in the front-end of the semiconductor manufacturing process (for example, CMP of polysilicon for polysilicon gates and CMP for shallow trench formation) where removal of contamination, especially metallic contamination, is critical as it may diffuse to the transistor structure and adversely effect the electrical performance of the device.

Other cleaning methods besides the use of scrubbers have been employed. For instance, chemical baths (e.g., wet benches) have been used for cleaning. With chemical baths, cleaning solutions are delivered to the wafer by submersing the wafer within the cleaning solution. Submersing a wafer in the cleaning solution may be disadvantageous because it requires large volumes of chemical solutions which will themselves become contaminated with repeated exposure to "dirty" wafers. Some of the solutions, for example, HF, can be expensive and dangerous to use. Thus, reducing the volume of solution used is desired. In the case of cleaning of silicon and processed semiconductor substrates, for example with HF, accurate control of the etch rate may be required. This is more difficult to accomplish in a bath, containing 50 to 100 wafers, than in a single wafer system with the ability to deliver small amounts of fresh chemicals to each and every wafer.

It may also be necessary for 300 mm processing to engage in a single wafer system to provide more uniform treatment across the surface of the wafer and, therefore, more consistent wafer to wafer process repeatability.

SUMMARY OF THE INVENTION

A method and apparatus for cleaning semiconductor substrates is described. The present invention includes a method and apparatus for delivering a very dilute solution of hydrofluoric acid (HF) to a core of a brush in a semiconductor substrate scrubber. The present invention also includes a method and apparatus for delivering a controlled amount of HF solution to the substrate through a brush to provide chemical mechanical scrubbing with in-situ etching of the substrate with the brush.

The present invention includes a method for controlling the thickness of an oxide being etched as required by different applications. The present invention includes a method for controlling the etch of a thin native oxide on silicon, permitting the removal of surface contaminants without the removal of the entire film, and, therefore, with the ability to maintain a hydrophilic surface state. A hydrophilic surface state is necessary for maintaining low levels of surface particles, especially in brush scrubbing systems, where the brush is in contact with the wafer surface during cleaning.

Additional features and benefits of the present invention will become apparent from the detailed description, figures, and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
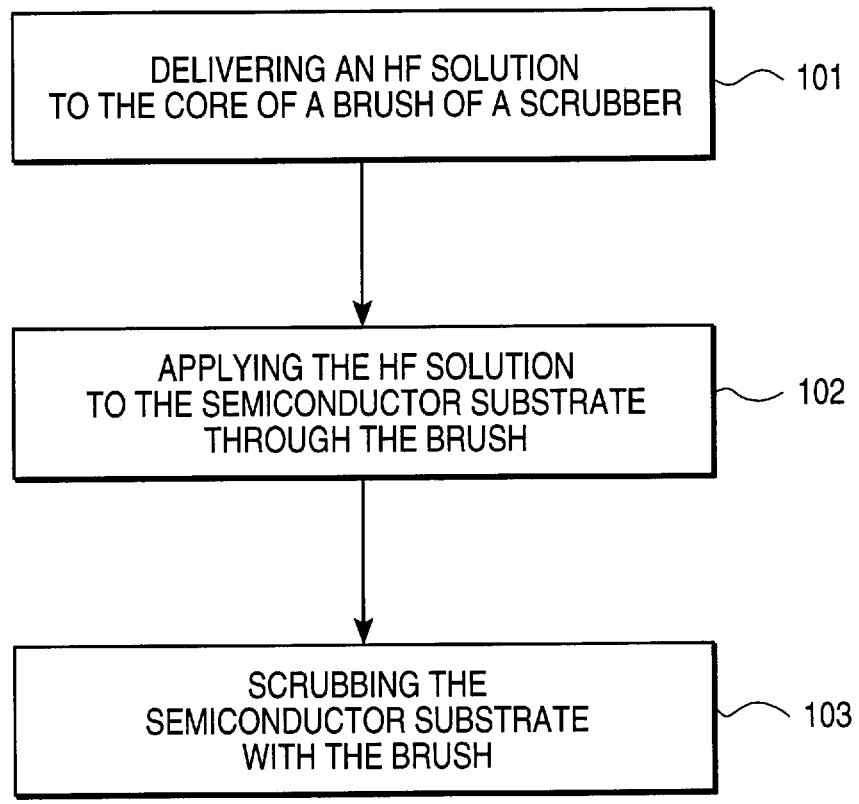
FIG. 1 is a flowchart of one embodiment of the process of the present invention.

A method and apparatus for cleaning silicon wafers and semiconductor wafers using an HF-based chemical mechanical scrubbing process is disclosed. The present invention is applicable in at least two areas. The first area of application concerns the cleaning of silicon substrates, including the final cleaning of prime silicon wafers, epitaxial silicon wafers and reclaimed silicon wafers and the post-polish cleaning of prime silicon, epitaxial silicon and reclaimed silicon wafers by silicon wafer manufacturers. The cleaning of silicon substrates also applies to the recovery of used, monitor silicon wafers by silicon or semiconductor manufacturers.

The second area of application concerns surface preparation of semiconductor substrates, including any surface preparation or cleaning process in the semiconductor manufacturing process where a very well controlled thin oxide etch is performed in a fashion that ensures the surface remains hydrophilic. This area of application includes, but is not limited to, pre-gate and pre-diffusion cleaning and CMP cleaning in the front-end for the formation of polysilicon gates and shallow trench isolation.

For both of these areas of application, the present invention described herein permits controlled removal of thin layers of oxide or semiconductor substrates which have chemically or thermally grown or deposited oxide layers which may or may not have been polished by CMP.

In the following description, numerous specific details are set forth such as specific materials, process steps, process parameters, solutions, etc. in order to provide a thorough understanding of the present invention. It will be apparent, however, to one skilled in the art that these specific details need not be employed to practice the present invention. In other instances, well known materials or methods have not been described in detail in order to avoid obscuring the present invention.

Overview of the Present Invention

The present invention provides a cleaning process for a number of applications found in the processing of semiconductor wafers. In the present invention, dilute HF is applied through the PVA brushes to the surface of the wafer during the scrubbing cycle.

The present invention takes into account compatibility of the PVA brush material with dilute HF, mechanical motion of the brushes and the ability of the scrubber to control the HF concentration profile, independent of input concentration, during the scrubbing cycle.

The control of the HF concentration profile is accomplished through the concentration control of the supply of the HF solution, control of the dispense flow and time and switching between chemical and DI water flow through the PVA brush.

This invention provides cleaning processes for a number of applications found in the processing of semiconductor wafers. This process is applicable to silicon wafers with thin native oxides and to semiconductor wafers with thin thermal or deposited oxides, polished or not polished by CMP, where it is desirable to remove a controlled amount of oxide with a chemical mechanical scrubbing process while keeping the surface hydrophilic. The exact concentration of HF being used depends on the process application as is further described in greater detail.

The present invention provides a cleaning process that applies dilute HF directly to the PVA brushes of a scrubber during the scrubbing cycle. In using HF in the scrubber, as opposed to a wet bath, the present invention takes into account the mechanical motion of the scrubber, the speed at which the HF reaches the surface of the brush and at which the HF may be taken away from the brush, as well as the compatibility of the PVA brush material with dilute HF.

For the cleaning of silicon wafers or processed semiconductor substrates with ultrathin chemical oxides (typically less than 20 angstroms), a process of the present invention uses very dilute HF (on the order of 0.005% HF) to perform an in-situ oxide etch with a controlled removal of less than approximately 15 angstroms. This process permits the removal of contaminants (both particles and plated residues) which are on the surface of the oxide and incorporated within the oxide, without converting the surface to a hydrophobic state. With the controlled oxide etch performed in the scrubber, a small amount of oxide remains on the surface of the wafer after chemical mechanical cleaning and, therefore, permits the wafer to remain hydrophilic. This hydrophilic surface state is required to achieve the state-of-the-art particle removal capability that is characteristic of brush scrubbers. Therefore, this process removes surface metallic contamination by etching a portion of the thin oxide without compromising the particle removal performance of the scrubber.

For the cleaning of processed silicon wafers with slightly thicker oxide layers (greater than approximately 30 angstroms), for example after thermal oxide growth or deposition or after front-end CMP for definition of shallow trench isolation (STI) or polysilicon gates, it may be desirable to perform a controlled thin oxide etch. For these applications, removal of metallic contamination which may be incorporated into the oxide from the CMP polishing process is critical as the metallic contamination may diffuse to the transistor and adversely effect the electrical performance of the device. Very dilute concentrations on the order of 0.005% HF may be sufficient depending upon the depth of penetration of the contamination in the oxide. If the metallic contamination resides more than 20 angstroms below the surface, a higher concentration of HF may be desirable. For all applications of interest, the amount of oxide that is removed is determined by the concentration of HF delivered to the brush and the dispense flow rate and time.

In the case of the removal of less than 15 angstroms of a native oxide on a silicon wafer, the very dilute concentration of HF of 0.005% has such a slow etch rate that times in the range of 20–60 seconds are acceptable. Whereas, for higher concentrations, time becomes more critical. If a given minimum throughput of process in the brush scrubber is required, the concentration of HF must be tailored to accommodate the desired amount of oxide to be removed.

In the case of back-end CMP applications such as the CMP of interlevel dielectric oxide and pre-metal oxide, removal of up to 100 angstroms of oxide may be required to adequately remove the metallic contamination incorporated into one oxide from the polishing process. In order to accomplish this removal in less than approximately 40 or 50 seconds, the concentration of HF needs to be raised to approximately 0.5–1.0% HF.

In the case of such back-end CMP applications as Tungsten (W) CMP for definition of the W plug structure, a balance between etch rate and materials compatibility must be met. The materials of the W plug structure must be compatible with the HF while sufficient HF must be present to remove the required amount of metallic contamination. The concentration of 0.5% HF for short exposure times (typically less than 40 seconds) may be required.

In one embodiment, the process is incorporated into a scrubber that scrubs both sides of a wafer simultaneously. One such system is an OnTrak Synergy™ brush-scrubbing which is chemically compatible with dilute acids. The combination of mechanical double sided scrubbing with in-situ thin oxide etching also provides an attractive alternative to multiple step processes involving more than one cleaning tool, without compromising wafer throughput.

FIG. 1 illustrates one embodiment of the process for cleaning a silicon wafer and/or semiconductor substrate in the present invention. Referring to FIG. 1, the cleaning processes comprises delivering a hydrofluoric acid (HF) solution to a core of a brush in a semiconductor substrate scrubber (processing block 101). In one embodiment, the brush comprises a PVA brush.

After delivering the hydrofluoric acid (HF) solution to the brush core, the HF solution is applied to the substrate through the brush (processing block 102). Chemical mechanical scrubbing of the substrate with the brush follows (processing block 103). Note that the application of the solution and the scrubbing of the substrate with the brush may occur at the same time.

The concentration of the HF solution is in the range of approximately 0.005%–1.0% HF, depending upon application (as explained above). In one embodiment, the concentration of HF in the HF solution is in the range of approximately 0.001 to 0.005 percent. In one embodiment, solution comprises a mixture of HF and water ($H_2O$) with the HF being approximately 0.005 percent of the solution. The concentration of the HF in the solution may be even more dilute or more concentrated depending upon the specific application.

In the present invention, the HF solution is applied for a predetermined amount of time. For instance, the HF may be dispensed through the brush for a variable length of time, such as HF dispense times of, for example, 20, 30, 35 and 40 seconds.

Thus, the present invention provides a new chemical mechanical process incorporating in-situ thin oxide etching with double sided scrubbing. The process of the present invention shows adequate control over oxide removal and oxide etch non-uniformity and, in some cases, maintains a high wafer throughput of greater than 55 wafers per hour.

It should be noted that the present invention may be employed in a number of substrate cleaning procedures. Although the present invention is described in conjunction with the scrubbing of a wafer, it will be appreciated that any similarly shaped, i.e. generally flat substrate, may be processed by the methods and apparatus of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) device, or substrates for processing other apparati and devices such as flat panel displays, multichip modules, etc. However, to avoid obscuring the invention the following description will describe wafer cleaning in general and as an example of one embodiment will describe the use of the present invention in a scrubbing process.

Overview of the Scrubbing Process

As an example, and not by limitation, the present invention is described in conjunction with a scrubbing process, more specifically, a scrubbing process in which both sides of the wafer are scrubbed. The scrubber includes a number of stations. Each of these stations represents one or more steps in the substrate cleaning process. Contaminated substrates are loaded at one end of the system and cleaned and dried substrates are unloaded from the other end of the system. An example of a system of this type is the Synergy™ scrubber available from OnTrak Systems, Inc. of Milpitas, Calif.

Figure 2:
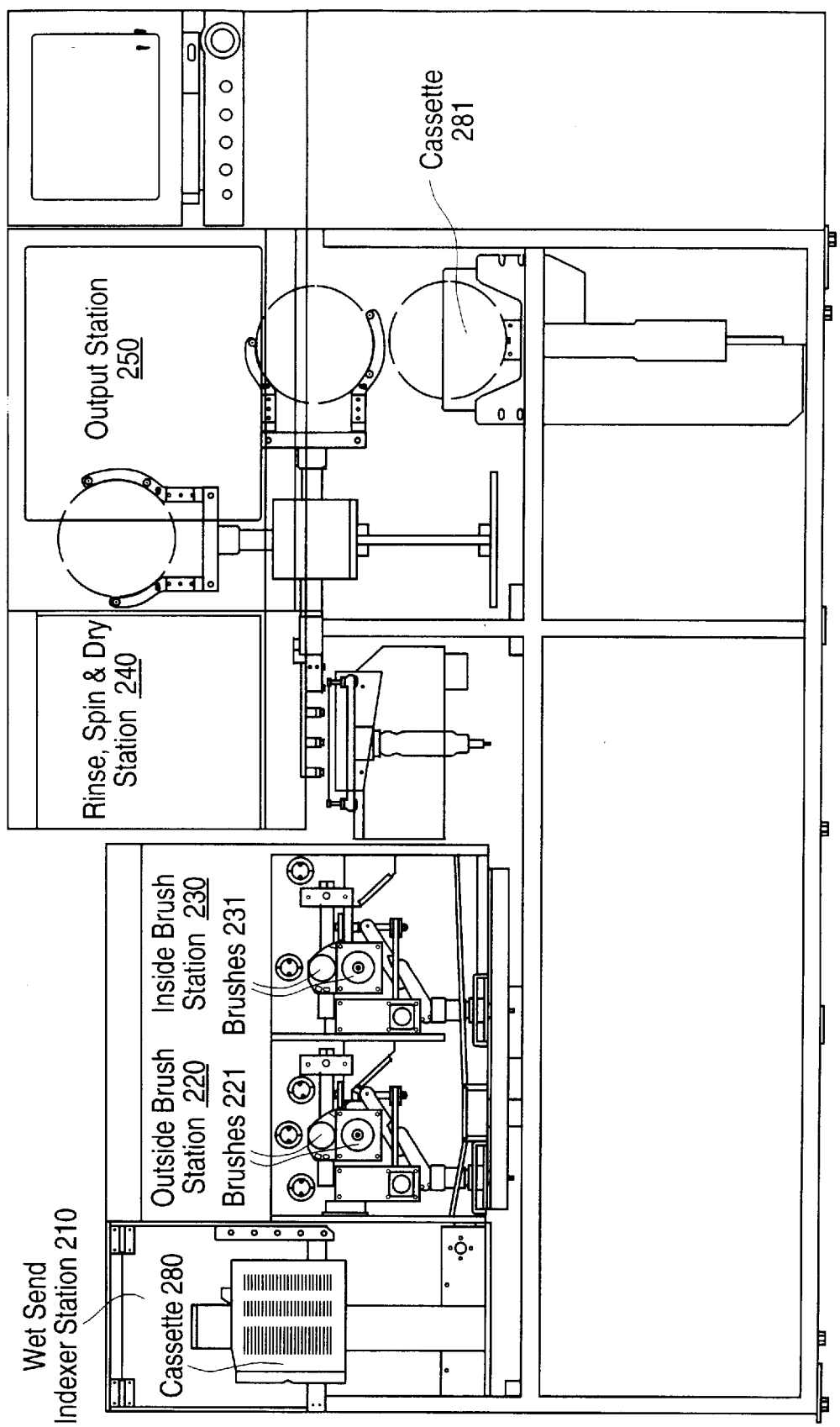
FIG. 2 represents a cross sectional view of a one embodiment of a scrubber system.

FIG. 2 represents a cross sectional view of a Synergy™ configuration (cleaning system). Usually, the contaminated substrates are delivered to the cleaning system after chemical mechanical planarization (CMP), from a wet bench, or from other processes resulting in contamination. At the start of the cleaning process contaminated substrates are loaded into a wafer cassette 280 (cassette) and the cassette 280 is then placed into the wet send indexer station 210. After cassette 280 is placed into wet send indexer station 210 the substrates are automatically removed from the cassette 280 and placed, one at a time, into the outside brush station 220.

In the outside brush station 220, a substrate is processed through a first scrub. In one embodiment, the substrate is treated with an ammonium hydroxide ($NH_4OH$) solution during the first scrub. The $NH_4OH$ solution is applied to the substrate through brushes 221.

The scrubbed substrate is then automatically removed from the outside brush station 220 and placed into the inside brush station 230. In the inside brush station 230, the substrate is processed through a second scrub. In one embodiment, the substrate is treated with a very dilute hydrofluoric acid (HF) solution during the second scrub. As in the first scrub step, the HF solution is applied to the substrate through brushes 231. Delivery of the HF chemical solution through the brushes is also discussed in detail below, following the overview of the scrub process. Note that in one embodiment, HF is used in both scrub stations.

After the second scrub the substrate is then automatically removed from the inside brush station 230 and placed into the rinse, spin and dry station 240. Rinse, spin, and dry station 240 rinses, spins, and dries the substrate. At this point the wafer has been cleaned.

Once the rinse, spin, and dry steps have been completed the substrate is then transported from the rinse, spin, and dry station 240 to the output station 250 where the substrate will be placed into cassette 281. The transfer is usually carried out by a robotic arm which lifts the substrate out of the rinse, spin, and dry station 240 by its edges and places it into the cassette 281. The cassette is then transferred to storage or to another cleaning or processing system.

It will be clear to one of ordinary skill in the art that some of the steps in the cleaning system described above may occur in another order or with different solutions other than as presented. For example, different solutions, such as water, citric acid, ammonium hydroxide, and ammonium citrate (or mixtures of solutions) may be used in place of the hydrofluoric acid solution in one of the brush stations.

It should be noted that while the following description illustrates the use of the present invention in a cleaning system in which both sides of the substrate are scrubbed, the present invention may be used in other cleaning systems and processes. For example, a cleaning system in which only a single side of the substrate is scrubbed.

Chemical Solution Delivery System

As referred to above in the discussion of the brush stations, a chemical delivery system that applies the chemical solution to the substrate through the brushes may be employed. The particular delivery system used may depend upon what chemical solution is being used and the desired concentration of the solution. In the following, a system is described designed for delivering a low concentration of a chemical (i.e. a previously dilute chemical solution) to the brush. Note that the chemical deliver system of the present invention may be designed for a variety of concentration levels.

Figure 3:
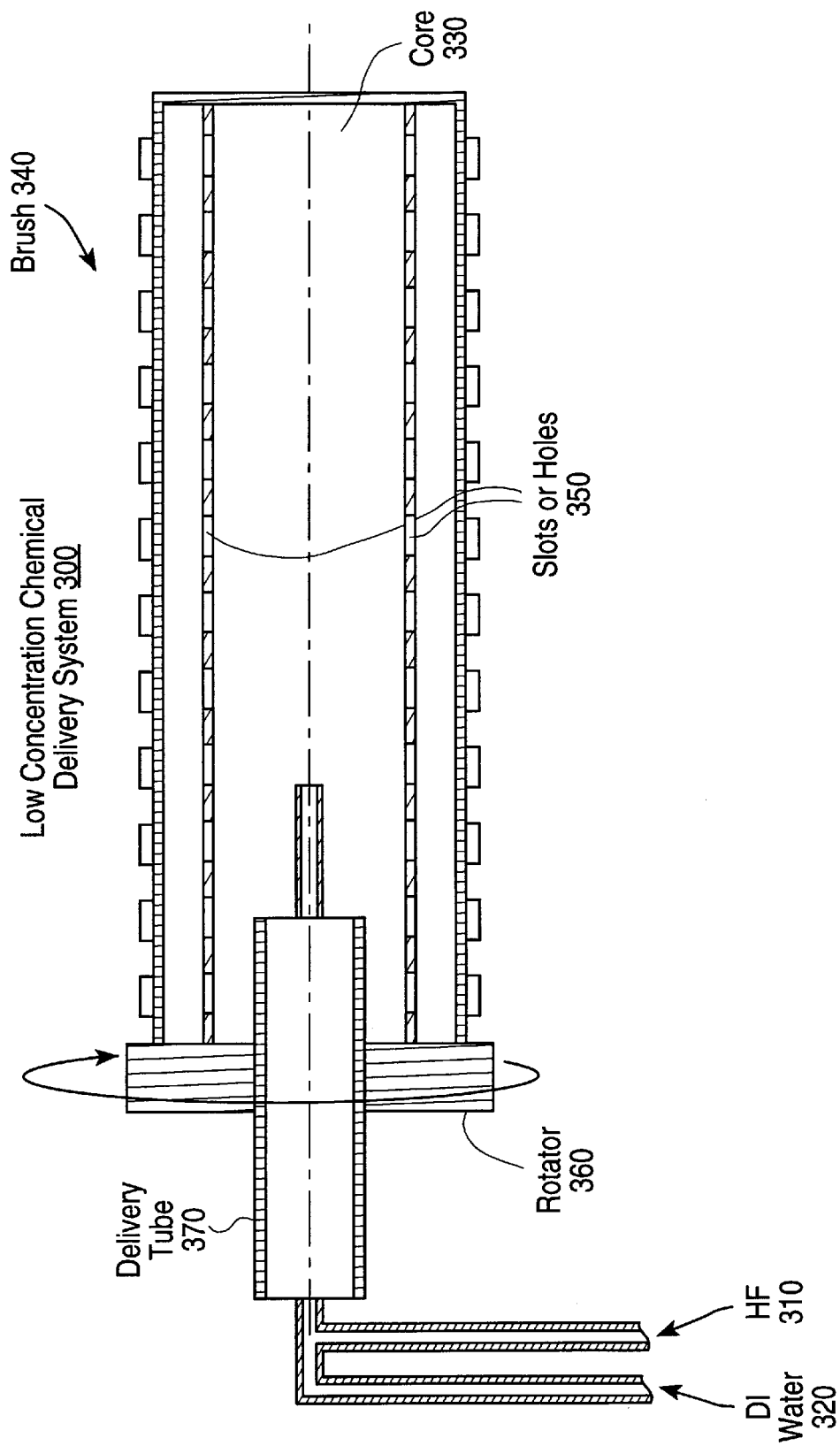
FIG. 3 illustrates one embodiment of a low concentration HF chemical delivery system.

One embodiment of a low concentration chemical delivery system is illustrated in FIG. 3. As an example, the low concentration chemical delivery system is described below in conjunction with the delivery of hydrofluoric acid (HF).

The HF is used to remove a thin layer of oxide from the substrate surface. In the case of a silicon wafer, the native oxide thickness is typically less than 20 Å. The substrate is scrubbed in a very dilute solution of HF to remove less than 15 Å of oxide so that surface remains hydrophilic. In order to have this level of control of oxide etch rate, the etch rate has been reduced by significantly reducing the concentration of HF. In one embodiment, the etching of less than 15 Å of oxide is accomplished using HF concentrations of 0.005 percent or less.

In one embodiment of the low concentration chemical delivery system 300, the premixed HF solution and water are sequentially supplied through supply lines 310 and 320, respectively. Also in the currently preferred embodiment described above, supply line 320 supplies the necessary amounts of water, for example deionized water, to the brush in order to keep the brush and substrate moist during the scrubbing process. When it is desired to perform the etch, supply line 320, which delivers water, is turned off and supply line 310, which delivers the HF solution, is turned on. After a predetermined amount of time, the HF supply line 310 is turned off and water supply line 320 is turned back on. It may or may not be necessary to implement the water supply in the brush in between HF process cycles (1 wafer=1 cycle).

Supply lines 310 and 320 run into delivery tube 370. Delivery tube 370 then delivers the HF solution or the deionized water into hollow core 330 of brush 340 at a predetermined flow rate. In one embodiment, the flow rate for HF may be in the range of approximately 0.2 to approximately 0.7 liters per minute and the flow rate for deionized water may be in the range of approximately 0.5 to approximately 1 liter per minute. It will be apparent to one with ordinary skill in the art that other arrangements may be used to supply the HF solution and deionized water, provided the specific flow rates for each chemical or solution are set appropriately, etc.

In one embodiment of the present invention, PVA sponge brushes are used. During the etch, the chemical solution (HF solution) is distributed to the brushes such that the brushes are evenly soaked (or saturated) with the HF solution. In one embodiment illustrated in FIG. 3, the brushes are saturated with the HF solution by absorbing the solution through the slots (or holes) 350 in the outer rim of hollow core 330. It will be apparent to one with ordinary skill in the art that other implementations and devices may be used to evenly soak the brushes, for example, baffles or channels may be used.

As brush 340 is being saturated with the HF solution it is rotated by rotation device 360. Rotation device 360 turns brush 340 in a clockwise (or counterclockwise) manner, thereby applying the HF solution to the substrate. Because brush 340 is saturated with the HF solution, the solution which is brought in contact with the wafer is uniformly applied to the substrate. Thus, the substrate is uniformly etched to remove the contaminants on the surface and within the oxide layer.

The HF solution is only applied until the desired amount of the oxide layer is removed, for example, in the above mentioned embodiment until less than approximately 15 Å are removed. In the case of a semiconductor substrate containing 30–100 Å of oxide (thermally grown or deposited), removal of a portion of the oxide, for example the top 20 Å, may be desired. Once the desired level is reached, the etch is stopped. To stop the etch, HF supply line 310 is turned off and water supply line 320 is turned back on. After supply line 310 is turned off, the brush and substrate are rinsed with only deionized water, thus stopping the etch.

It should be noted and it will be apparent to one with ordinary skill in the art that other methods for rinsing the brush and substrate, for example spraying with deionized water, are also available. Additionally, it will be apparent to one with ordinary skill in the art that the low concentration (and higher concentration) delivery systems may be used in either brush station one or brush station two or the same delivery system may be used in both brush stations.

The above described chemical delivery system (i.e. chemical delivery through the brush) applies chemical solutions in a uniform manner to the semiconductor substrate and reduce the volumes of chemical solutions used in a scrubbing process.

Although specific embodiments, including specific equipment, process steps, process parameters, materials, solutions, and etc. have been described, various modifications to the disclosed embodiments will be apparent to one of ordinary skill in the art upon reading this disclosure. Therefore, it is to be understood that such embodiments are merely illustrative of and not restrictive of the broad invention and that this invention is not limited to the specific embodiments shown and described.

Thus, a method and apparatus for the cleaning of silicon wafers and semiconductor substrates with very dilute hydrofluoric acid (HF) has been described.

What is claimed is:

1. A method of cleaning a semiconductor substrate comprising:

turning off a first supply line which supplies water to a core of a brush in a semiconductor substrate scrubber;

turning on a second supply line: to supply a hydrofluoric acid (HF) solution to the core;

delivering the HF solution through the core at a predetermined flow rate;

applying the HF solution to the exterior of the brush through the interior of the brush from the core by absorbing the HF solution through openings in an outer rim of the core;

chemical mechanical scrubbing the substrate with the brush in the presence of the HP solution;

turning off the second supply line; and turning on the first supply line, such that he HF solution and water are sequentially supplied to the core of the brush.

2. The method defined in claim 1 wherein the step of chemical mechanical scrubbing removes oxide on the substrate while maintaining a hydrophilic surface state on the substrate.

3. The method defined in claim 1 wherein the brush comprises a PVA brush.

4. The method defined in claim 1 wherein the concentration of HF in the HF solution is approximately 0.005 percent.

5. The method defined in claim 1 wherein the solution is applied for a predetermined amount of time.

6. The method defined in claim 1 wherein the HF solution is applied through the brush while scrubbing the semiconductor substrate with the brush.

7. The method defined in claim 1 further comprising a step of rinsing the brush scrubbing the semiconductor substrate.

8. The method defined in claim 1 wherein the predetermined flow rate ranges from 0.2 to 0.7 liters per minute.

9. A method for removing contaminants on the surface of or incorporated within an oxide on a semiconductor substrate, said method comprising the steps of:

receiving a semiconductor substrate in a chemical mechanical scrubber; and performing a scrubbing cycle in a brush station comprising turning off a first supply line which supplies water to a core of a brush in a semiconductor substrate scrubber;

turning on a second supply line to supply a hydrofluoric acid (HF) solution to the core;

delivering the HF solution to the core at a predetermined flow rate;

applying the HF solution to the exterior of the brush through the interior of the brush from the core by absorbing the HF solution through openings in an outer rim of the core;

scrubbing the semiconductor substrate to etch the oxide while maintaining a hydrophilic surface state on the semiconductor substrate.

10. The method defined in claim 9 wherein the concentration of HF in the HF solution is in a range of approximately 0.005 percent or less.

11. The method defined in claim 9 wherein the concentration of HF in the HF solution is approximately 0.005 percent.

12. The method defined in claim 9 wherein the brush comprises a PVA brush.

13. The method defined in claim 9 wherein the predetermined flow rate ranges from 0.2 to 0.7 liters per minute.

* * * * *